US005793322A

United States Patent [19]
Fossum et al.

[11] Patent Number: 5,793,322
[45] Date of Patent: Aug. 11, 1998

[54] SUCCESSIVE APPROXIMATION ANALOG-TO-DIGITAL CONVERTER USING BALANCED CHARGE INTEGRATING AMPLIFIERS

[75] Inventors: Eric R. Fossum, La Crescenta; Zhimin Zhou; Bedabrata Pain, both of Los Angeles, all of Calif.

[73] Assignee: California Institute of Technology, Pasadena, Calif.

[21] Appl. No.: 744,955

[22] Filed: Nov. 7, 1996

Related U.S. Application Data

[60] Provisional application No. 60/006,264, Nov. 7, 1995.
[51] Int. Cl.$^6$ ................................................. H03M 1/38
[52] U.S. Cl. ................................................. 341/161
[58] Field of Search ................................. 341/155, 161

[56] References Cited

U.S. PATENT DOCUMENTS

| 4,647,903 | 3/1987 | Ryu | 340/347 |
| 5,084,704 | 1/1992 | Parrish | 341/164 |
| 5,247,299 | 9/1993 | Lim et al. | 341/136 |

OTHER PUBLICATIONS

Fossum, E.R., Zhou, Z. and Pain, B., "Successive Approximation ADC for Focal-Plane Applications Using Balanced Charge Integrating Amplifiers" SPIE, 1994.

Fossum E.R. and Zhou, Z., "Capacitively Coupled Successive Approximation Ultra Low Poser ADC for Focal-Plane Applications", SPIE, 1994.

Pain, B. and Fossum, E.R., "Approaches and analysis for on-focal-analog-to-digital conversion", SPIE vol. 2226, 1994 (Jun.).

*Primary Examiner*—Brian K. Young
*Attorney, Agent, or Firm*—Fish & Richardson P.C.

[57] ABSTRACT

An analog-to-digital converter for on-chip focal-plane image sensor applications. The analog-to-digital converter utilizes charge integrating amplifiers in a charge balancing architecture to implement successive approximation analog-to-digital conversion. This design requires minimal chip area and has high speed and low power dissipation for operation in the 2–10 bit range. The invention is particularly well suited to CMOS on-chip applications requiring many analog-to-digital converters, such as column-parallel focal-plane architectures.

14 Claims, 13 Drawing Sheets

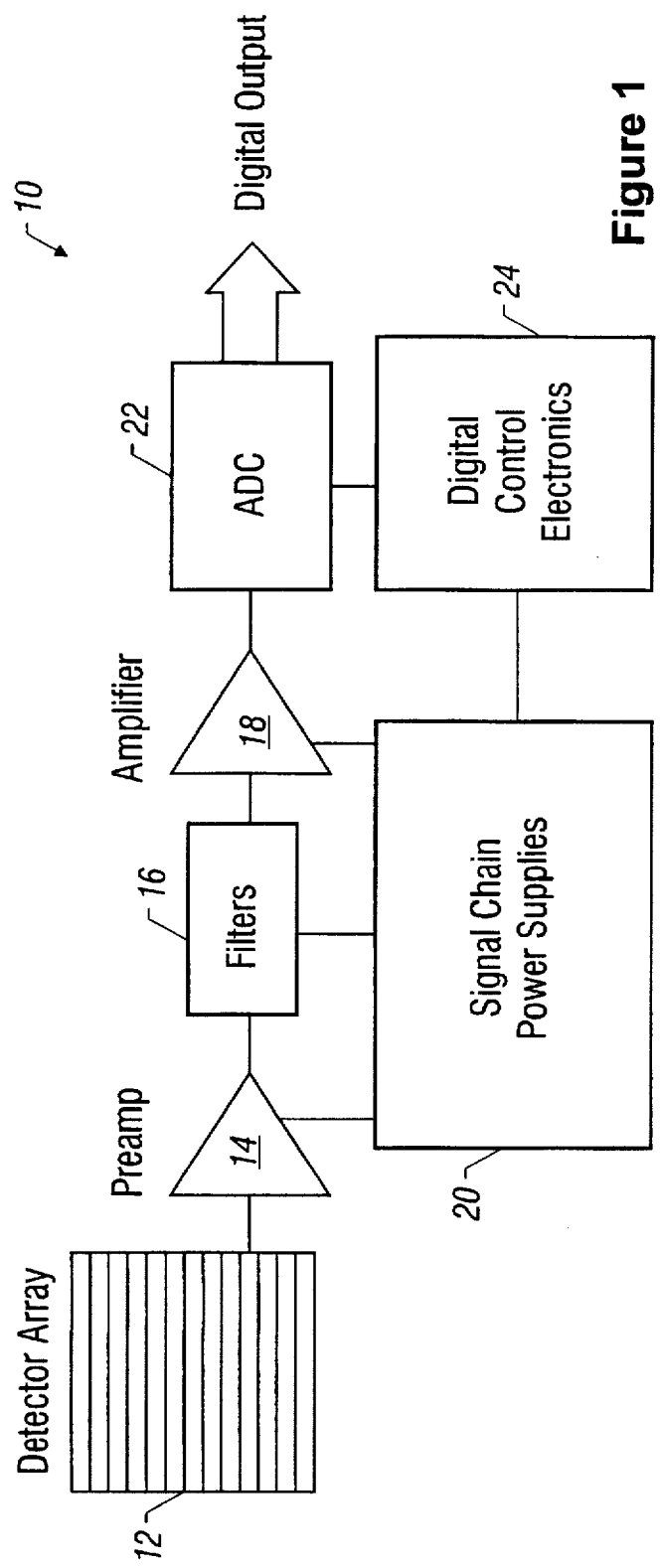
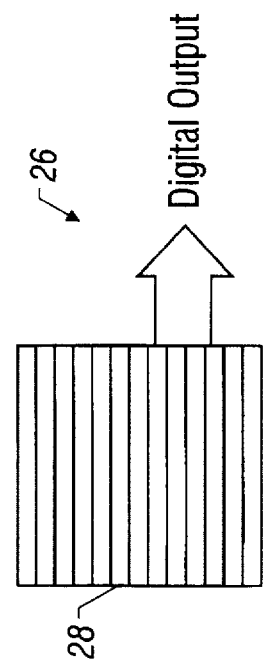
Figure 1 (Prior Art)
Figure 2 (Prior Art)

| Transistors | Size |
|---|---|
| M1,M2 | 8/2 |
| M3,M4,M11,M15 | 12/2 |
| M5,M6 | 6/2 |
| M7-M10,M12,M14 | 4/2 |

$\tau_{strbb} < \tau_{strb} < \tau_{strb1b} < \tau_{strb1}$ $\tau_{strbbd} < \tau_{strb1b}$

SUCCESSIVE APPROXIMATION ANALOG-TO-DIGITAL CONVERTER USING BALANCED CHARGE INTEGRATING AMPLIFIERS

This application claims the benefits of the U.S. Provisional application Ser. No. 60/006,264, filed on Nov. 7, 1995.

ORIGIN OF THE INVENTION

The invention described herein was made in the performance of work under a NASA Contract and is subject to the provisions of Public Law 95.517 (35 U.S.C. 202) in which the contractor has elected to retain title.

FIELD OF THE INVENTION

The invention is related to analog-to-digital converters. More specifically, the present invention defines a successive approximation analog-to digital converter using balanced charge integrating amplifiers.

BACKGROUND AND SUMMARY OF THE INVENTION

There are many applications for analog-to-digital converters. Real world analog information must be converted into a digital form before it can be processed by digital computers. There are a number of types of analog-to-digital converters employing various conversion methods. Each of these methods offer different performance characteristics such as operating speed, power consumption, achievable accuracy, chip area, required amplifier gain, bandwidth, impedance matching and noise.

Conventional electronic systems often package analog-to-digital converters (ADCs) on a separate integrated circuit. Generally, increased electronic integration offers a number of advantages. Hence it is desirable to integrate ADCs onto existing integrated circuit chips. This would reduce the total mass, volume, and system power, as well as the number and volume of power supplies in many systems. An indirect benefit would be a lowering of system design time and design error rate.

One example of an application for such integrated analog-to-digital converters is in the field of semiconductor imagers. There have been recent efforts to implement on-chip ADC onto detector arrays, such as focal-plane arrays (FPAs). Typically, signal chains introduce noise in focal-plane arrays. Therefore, besides the above-described advantages of integrating ADCs, an FPA system with an on-focal-plane (on-chip) ADC would be expected to exhibit superior noise performance. This is due to the inevitable introduction of unwanted noise through cross-talk, clock pickup, power supply noise, electromagnetic interference (EMI) and other mechanisms. Since the serial data rate in the signal chain is typically the highest rate in the entire imaging system, white noise is introduced with a maximum bandwidth. Clock noise and other capacitively-coupled sources are also known to increase with increasing data rates.

On-chip ADCs would operate at a significantly lower bandwidth, ameliorating these effects. Since no off-chip analog cabling is required, pick up and vibration sensitivity would also be eliminated. More fundamentally, multiple sampling, or over-sampling, of the detector signal can be much more effectively performed on the focal plane compared to off-chip. Thus, on-chip ADC would eliminate mechanisms for the introduction of noise, as well as permit increased signal-to-noise ratio through over-sampling techniques. On-focal-plane ADC can also lead to a reduction in total FPA power dissipation.

Furthermore, digital signals can be digitally processed on-chip as a further level of integration. For example, on-chip digital signal processing can be used for autonomous sensor control, e.g. exposure control, or for control, of windowed region-of-interest readout. Image compression can also be achieved on-chip to reduce off-chip drive requirements.

The incorporation of high resolution ADCs on focal-plane arrays has proved to be a difficult challenge. There is much less silicon area available on focal-plane arrays than there is on stand-alone ADCs. An ADC with serial architecture would be required to operate with the highest bandwidth of all focal-plane components, since the conversion rate would be the same as the pixel data rate. In a scientific application, a typical pixel data rate is about 100 KHz. In defense applications and in certain scientific applications, data rates in excess of 100 MHz are often required. The reliability of CMOS at such high data rates circuits is also a concern.

These problems are compounded in scientific applications which routinely require resolutions greater than sixteen bits. This level of resolution generally requires over-sampling techniques that drive the ADC clock rate even higher. On-chip ADCs would also increase focal-plane power dissipation because of the required high speed operation of several analog circuits; compared to the single driver amplifier used in conventional focal-plane readouts. For these reasons, the inventors believe that a serial on-focal-plane ADC architecture would not be optimal.

Another alternative is a massively parallel architecture; for example, with one ADC on each readout pixel in the focal-plane array. However, only a relatively small area is available for most applications; typical pixel size is about 30 $\mu m^2$. Thus, this does not leave enough room for conventional ADC approaches which require a relatively large chip area.

In summary, speed limitations in serial architectures and area limitations in parallel architectures have restricted the implementation of on-focal-plane ADCs. The present inventors have recognized that the use of a semi-parallel architecture can be expected to preserve the advantages, and mitigate the adverse consequences, of both of these architectures. A semi-parallel architecture would, for example, utilize an ADC for every column of the readout. This affords virtually unlimited chip area in one dimension and tight, but feasible, design space in the other dimension. Such tall, skinny, ADCs would operate, in parallel, on one row of image data at a time.

A number of ADC techniques are available for use in focal-plane applications. These conversion methods differ from each other in terms of operating speed, power consumption, achievable accuracy, and chip area. An important difference between on-focal-plane ADC and a single chip monolithic ADC, is that an on-focal-plane ADC must occupy a relatively small chip area. The real estate becomes an even more serious concern for column-parallel approaches. Due to the unavailability of a large chip area, focal-plane ADCs cannot usually take advantage of elaborate trimming techniques for resolution enhancement. Thus, the immunity of the ADC performance to circuit parameter mismatch is a problem.

Low power operation is preferred in focal-plane ADCS. Maximum overall power dissipation in the combined ADCs would typically be limited to one to 20 mW. The required resolution and conversion rates vary widely depending upon applications. The conversion rate depends on the array size, the integration time, and the choice of ADC architecture, and is usually in the range of 1 KHz to 1 MHz. Scientific infrared imagers usually demand high resolution (greater than sixteen bits), but several other applications require only eight to ten bit accuracy. Thus there is a wide range of operating requirements. Conversion rate requirements vary from 1 KHz to 1 MHz, and the bit resolution requirements vary from six to over sixteen bits. There does not appear to be a single ADC algorithm that optimally meets all of these widely varying requirements.

Candidate ADC algorithms which meet some of these constraints include flash ADCs, successive approximation ADCs, single/dual slope ADCs, and over-sampled delta-sigma ADCs. For ADC operation in the two to ten bit range, the inventors have recognized that the successive approximation ADC is an attractive alternative for focal-plane applications. This kind of ADC achieves high resolution at medium speeds and with minimal power dissipation. One advantage with successive approximation is that for n bits, only n comparisons need to be made. This results in high speed and low low power dissipation. Furthermore, this architecture does not require excessive chip area.

The successive-approximation analog-to-digital conversion process is essentially a "ranging" algorithm. Each conversion step estimates the upper and lower bound within which the input voltage lies. The analog voltage is approximated to within a small error by successively shrinking these bounds. The ranging can be done in several ways. One successive-approximation algorithm that is compatible with CMOS implementation is described in S. Ogawa, et al., "A switch-capacitor successive-approximation A/D converter", IEEE Trans. Instrum. and Meas., Vol. 42, pp. 847–853, 1993. One disadvantage with that approach is that the residual voltage decimates to approximately $V_{ref}/2^n$ after n conversion steps. As a result, the ADC can be susceptible to circuit noise, offset and non-idealities.

It is hence an object of the present invention to overcome these disadvantages in order to realize many potential advantages of on-focal-plane ADC. It is also an object of the invention to provide an ADC which requires minimal chip area and power consumption. This is done according to the invention by the use of a charge balancing approach to implement a successive approximation ADC. In particular, the invention uses charge-integrating amplifiers to implement charge balancing.

An initial signal to be digitized is converted into the charge domain using a capacitor. The charge is then transferred to a first branch of a charge-integrating amplifier circuit. For a differential signal (such as pixel sample and reset outputs) the other side of the input signal is also converted to charge and put on a second branch using a second charge integrating amplifier circuit. A reference voltage is also converted to charge and split in half using capacitors and a switch. The first and second branches are compared in a comparator and the one-half reference charge is transferred to the branch with the lessor signal. The remaining half of the reference charge is split again. This results in two reference charges, each equal to one-fourth the original value. The branches are again compared by the comparator and the charge is transferred again to the branch with the lesser signal. This process is continued for n bits resulting in n-bits of resolution. Each comparison represents a new bit in the output digital word, starting from the most significant bit. Each time the second branch is selected, a "one" is generated for the digital word.

Since only n comparisons are needed for n bits of resolution, the invention operates at high speed with low power dissipation. It is particularly well suited for focal-plane applications in the 2–10 bit range. In addition, the architecture utilizes CMOS charge-integrating amplifiers, resulting in an ADC well suited for CMOS compatible focal-plane applications. Furthermore, the architecture of the invention requires minimal chip area and is well suited to column-parallel on-chip focal-plane applications.

BRIEF DESCRIPTION OF THE INVENTION

These and other aspects of the invention will now be described in detail with reference to accompanying drawings, wherein:

FIG. 1 shows a system signal chain for a focal-plane array imaging device with off-chip analog-to-digital converters;

FIG. 2 shows a system signal chain for a focal-plane array with on-chip analog to digital converters;

DESCRIPTION OF THE PREFERRED EMBODIMENTS

Figure 3:
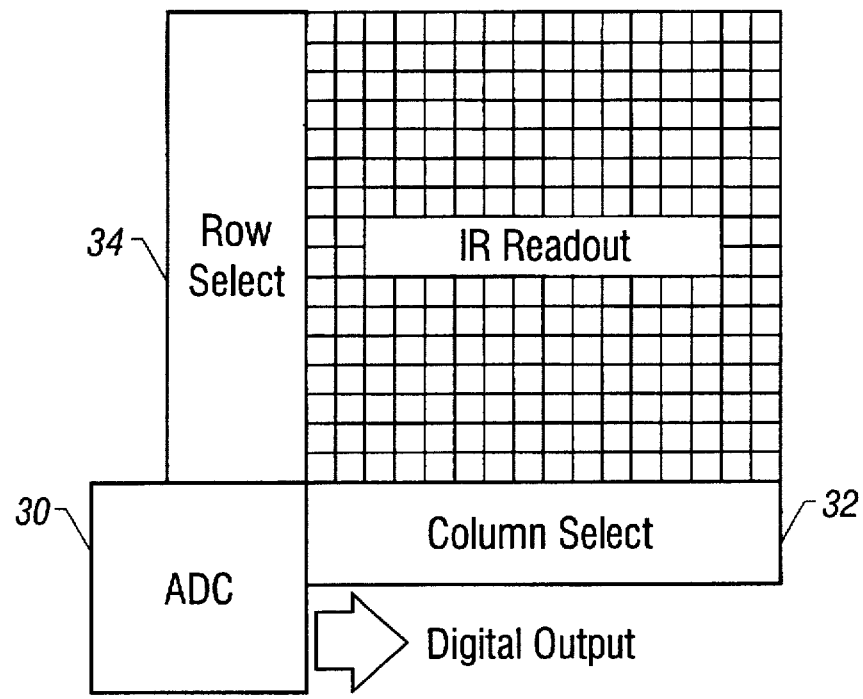
FIG. 3 shows the architecture for an on-focal-plane analog-to-digital converter employing serial architecture.

FIG. 1 shows a conventional focal-plane array system with off chip analog-to-digital conversion. The focal-plane array system 10 includes a focal-plane array detector 12 which generates an analog output that is processed by a preamp 14, filter 16, and amplifier 18, all of which are powered by a plurality of power supplies 20. The output of the amplifier 18 is fed to a separate integrated circuit containing an analog- to digital converter 22 which is controlled by a digital control electronics circuit 24.

The invention provides the many advantages of integrating analog-to-digital circuits onto a detector array chip by employing the configuration shown in FIG. 2. The invention provides a focal-plane array system 26 that includes a detector array 28 having on-chip analog-to-digital conversion.

The functional equivalent of all of the off-chip circuitry shown in FIG. 1 is now included on the detector array chip. As a result, the array 28 itself can produce a digital output directly.

Active pixel sensors ("APS") represent a new generation of image sensor structures which include associated image processing structure on the chip.

FIG. 3 shows one possible on-focal-plane analog-to-digital conversion architecture. It uses a serial analog-to-digital converter. This approach simply integrates a single analog-to-digital converter monolithically with readout electronics, including column select 32 and row select 34. However, this configuration cannot handle extremely high clock rates (such as one megahertz) without over-sampling techniques. High speed operation will also increase focal-plane power dissipation. Also, there is very little silicon area available for the high resolution analog-to-digital converter 30 that would be required with this architecture.

Figure 4:
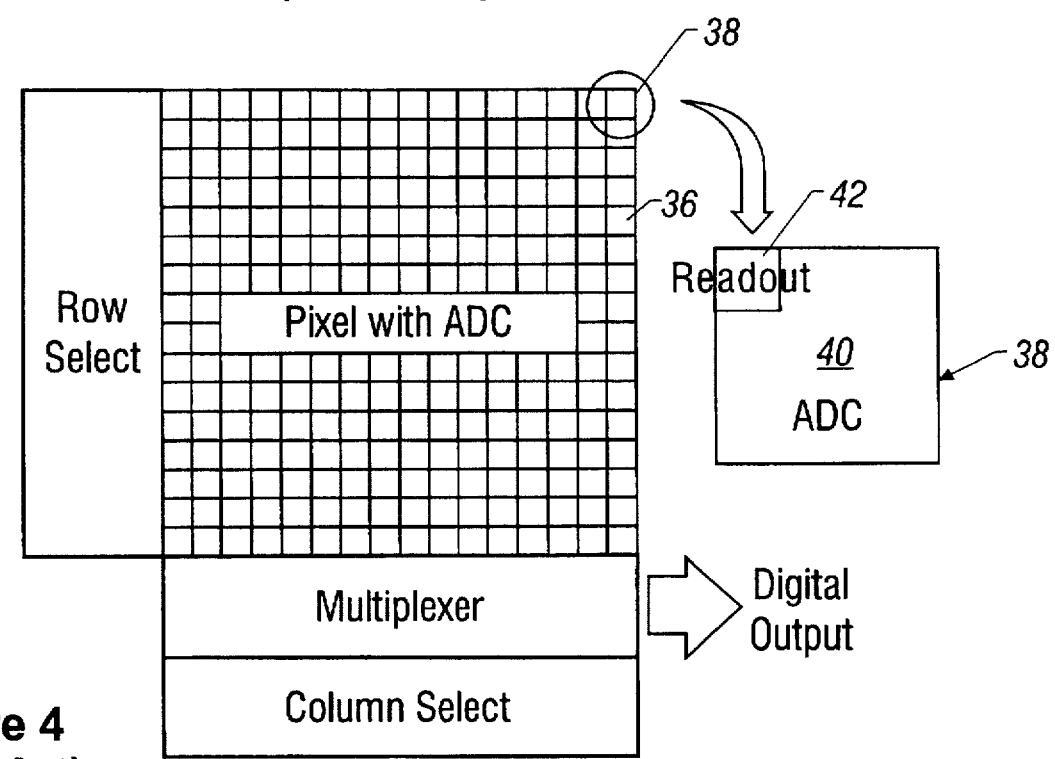
FIG. 4 shows an architecture for an on-focal-plane analog-to-digital converter employing a massively-parallel architecture.

Another alternative is to employ a single analog-to-digital converter for each pixel, as shown in FIG. 4. Here, in the focal-plane array 36, each pixel 38 includes both the analog-to-digital converter 40 and the readout electronics 42. This may not be feasible given the relatively small area available for most applications where the pixel size is typically 30 $\mu m^2$.

Figure 5:
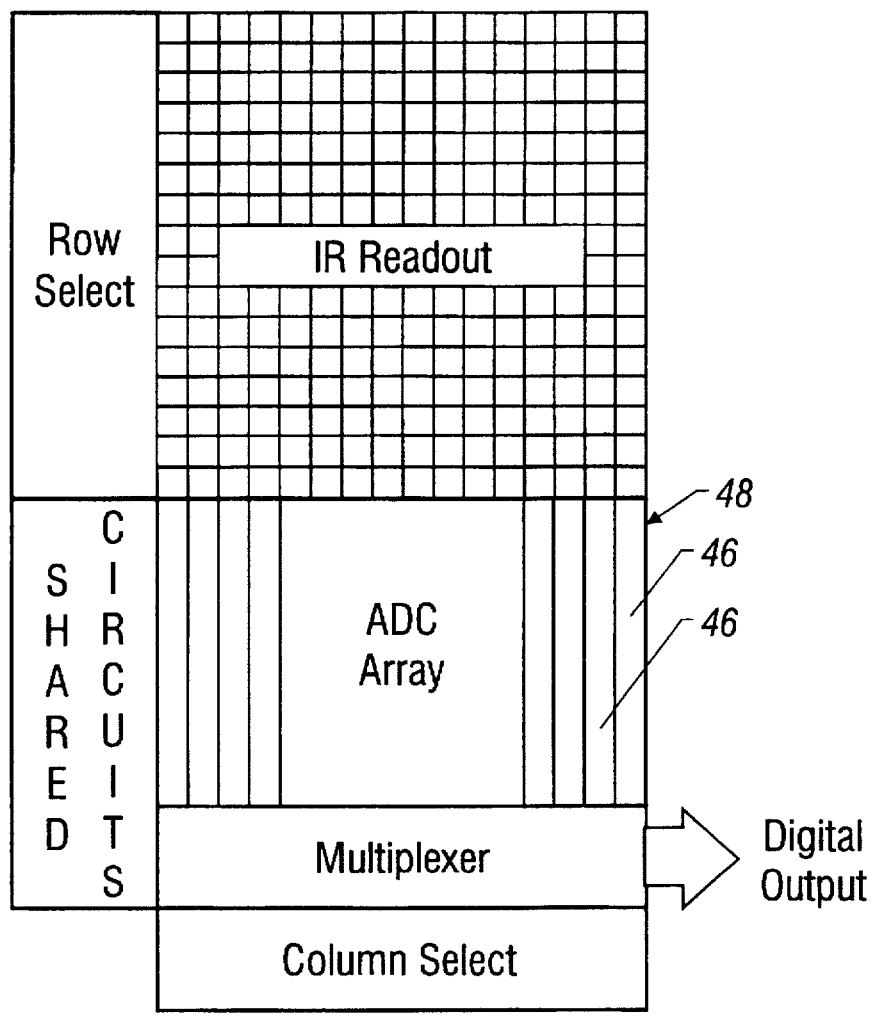
FIG. 5 shows an architecture for an on-focal-plane analog-to-digital converter employing column-parallel architecture.

The speed limitations of the serial architecture, and the area limitations of parallel architecture, can be mitigated by the use of a semi-parallel architecture such as the one shown in FIG. 5. The semi-parallel architecture focal-plane array system 44 employs individual analog digital converters 46 for every column of the readout. These individual analog-to-digital converters (ADCs) 46 form an analog-to-digital converter array 48. This design affords virtually unlimited chip area in one dimension and tight but feasible design space in the other dimension.

These ADCs 46 operate in parallel on a row of image data at a time. The conversion rate in this case is the row readout rate, which is 100-1,000 times slower than the serial pixel data rate. For example, for a 1,024 by 1,024 array having a serial pixel data rate of 50,000 pixels per second, the corresponding ADC data rate for a one ADC per column architecture would be just 50 pixels per second.

One alternative semi-parallel architecture is to employ a single ADC for multiple columns, where the number of columns sharing an ADC is small, such as 32. This derivative architecture would require submultiplexing of the multiple columns to the ADC. This affords more design area in the transverse direction at the expense of increased data rate.

Semi-parallel architecture also affords relatively low power operation. This is due to the fact that, unlike digital circuits, power dissipation in analog circuitry depends super-linearly on the operating frequency. As a result, the total power dissipation for a semi-parallel architecture can be lower than for a serial architecture for the same pixel data rate.

Additionally, the semi-parallel architecture allows the use of "share circuits", i.e., a single circuit block (e.g. reference generator) can serve the entire ADC bank. This can also lead to considerable power and area saving. Since the conversion rate is much lower than that in a serial architecture, the analog circuits may be biased in sub-threshold, affording further reduction in power. One concern, however, is the matching of the ADC characteristics between the columns. A lack of matching can generate fixed-pattern noise in the output data. Fixed pattern noise can be reduced by using well-known techniques such as "double delta sampling". This involves storing the reset level and the signal level on separate capacitors and performing correlated double sampling.

The present invention employs a successive approximation algorithm for implementing on-chip ADC. The successive approximation concept is well known in the art. In general it works as follows by making incremental guesses, where each guess is incremented by $\frac{1}{2}^n$ where n is the iteration number. For example, if it is desired to convert an analog voltage between zero and one volt to a digital signal, a guess of one-half volt is made. That value is compared against the input. If the input is 0.7 volts, a higher guess should be made. The next guess would be one-half (the old guess) plus one-fourth volts ($\frac{1}{2}^{n=2}$), or 0.75 volts. This is too high. So the next guess is one-half plus one-eighth ($\frac{1}{2}^3$) volts, or 0.125 volts. This is still too low, so the next guess is one-half plus one-eighth plus one-sixteenth volts ($\frac{1}{2}^4$), or 0.175 volts. Again, this is too low so the next guess is one-half plus one-eighth plus one-sixteenth plus one-thirtysecond ($\frac{1}{2}^5$). Each iteration represents one bit resolution. This process continues until the desired number of bits is readout.

There are many ways to implement successive approximation. Chip area and power are a paramount concern for image sensor applications. With the present invention, the inventors have found a technique for implementing successive approximation analog-to-digital conversion in a manner which utilizes minimal chip area and power. Thus it is particularly well suited to image sensor applications. It is particularly well suited for a column-parallel architecture having an analog-to-digital converter array on-chip, where the analog-to-digital converter processes data from one or more columns.

The ADC of the present invention accomplishes this by using a charge balancing approach. This method of performing ADC successively accumulates charge on two branches of a circuit, in an attempt to balance the signal on the two sides. For example, assume that an input signal is represented by 0.7 units of charge on the "A" branch of a circuit. The circuit "B" branch is initially set to no charge. The signals on the two branches are compared using a charge-to-voltage converter and a voltage comparator. The branch with less charge ("B") is selected by the comparator, and one-half unit of charge is added to that side. The two branches are again compared, and again, the "B" branch is selected. One-fourth units of charge is added to the "B" branch. The branches again are compared. This time the "A" branch is found to have less charge (0.7 v. 0.75), and one-eighth units of charge is added to the "A" branch. Now the "A" branch has 0.825 units of charge and the "B" branch has 0.75 units. Again, the branches are compared and the "B" branch is found lacking, so one-sixteenth units of charge is added to that side. The process is continued until n comparisons are performed for n-bits of resolution. Each comparison represents a new bit in the output digital word, starting with the most significant bit. Each time the "B" branch is selected, a "one" is generated for this digital word.

The present inventors have discovered a way to implement this charge balancing approach in a CMOS circuit employing charge integrating amplifiers. In the present invention, an input signal to be digitized is converted to the charge domain using a capacitor. The charge is then transferred to the "A" branch of a charge-integrating amplifier circuit. If the signal is differential, then the other side of the signal is also converted to charge and put on the "B" branch using a second charge-integrating amplifier circuit.

A reference voltage is similarly converted to charge, and split in half using two capacitors and a switch. The "A" and "B" branches are compared and the one-half reference charge is transferred to the branch with the lesser signal. The remaining half of the reference charge is again split into one-fourth of the reference charge. The branches are again compared and the charge is transferred again to the branch with the lessor signal. The process is continued for n bits. Each comparison represents a bit in the output digital word where a "one" is generated each time the "B" branch is selected.

Figure 6:
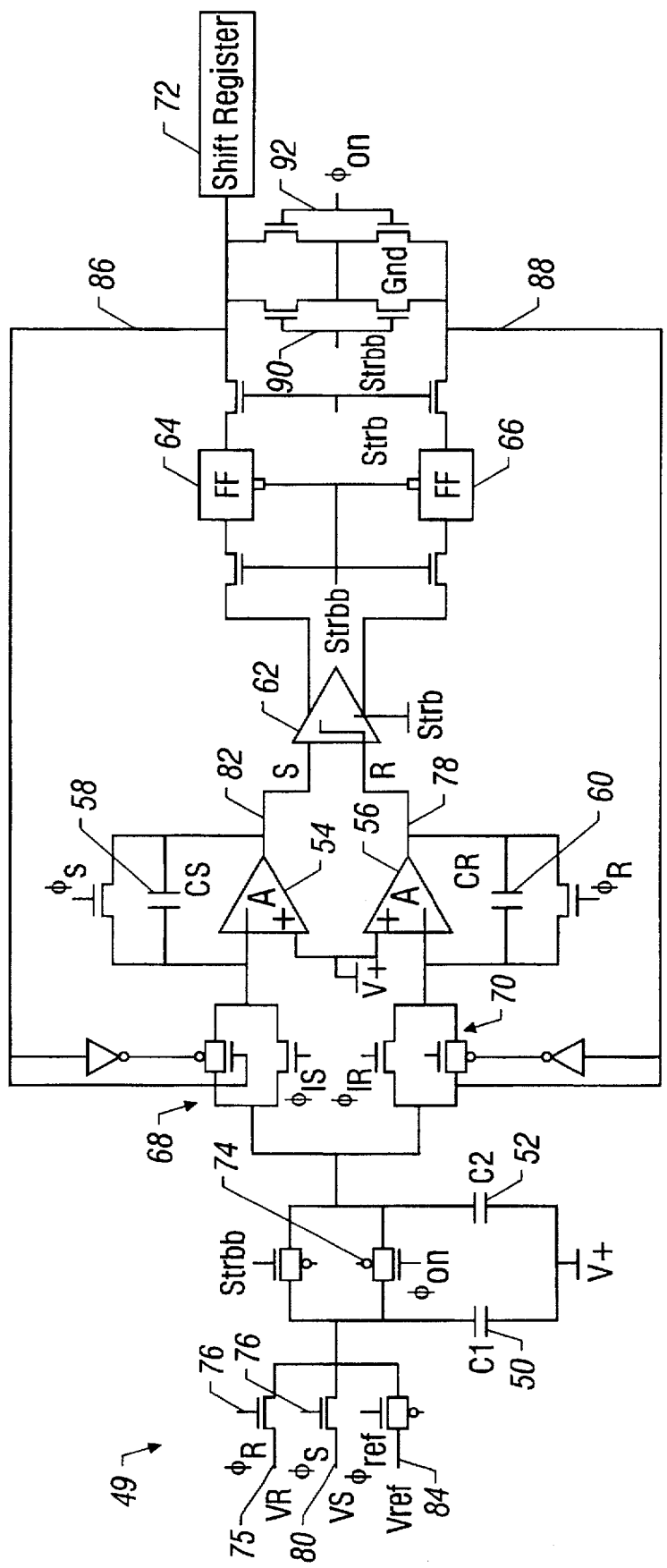
FIG. 6 shows the charge balancing successive approximation ADC using charge-integrating amplifiers of the present invention.

FIG. 6 shows the circuit block diagram of a preferred embodiment of the ADC 49 of the invention. It has two sample and hold capacitors 50, 52 (C1 and C2), two charge integrating amplifiers comprising charge transimpedance integrating amplifiers (CTIAs) 54, 56 with two feedback capacitors 58, 60 (CS and CR), and a strobe comparator 62. Two flip flops 64, 66 are used for buffering the digital output feedback to a pair of CTIA input switches 68, 70, and a shift register 72 is provided to store the output digital words.

Figure 7:
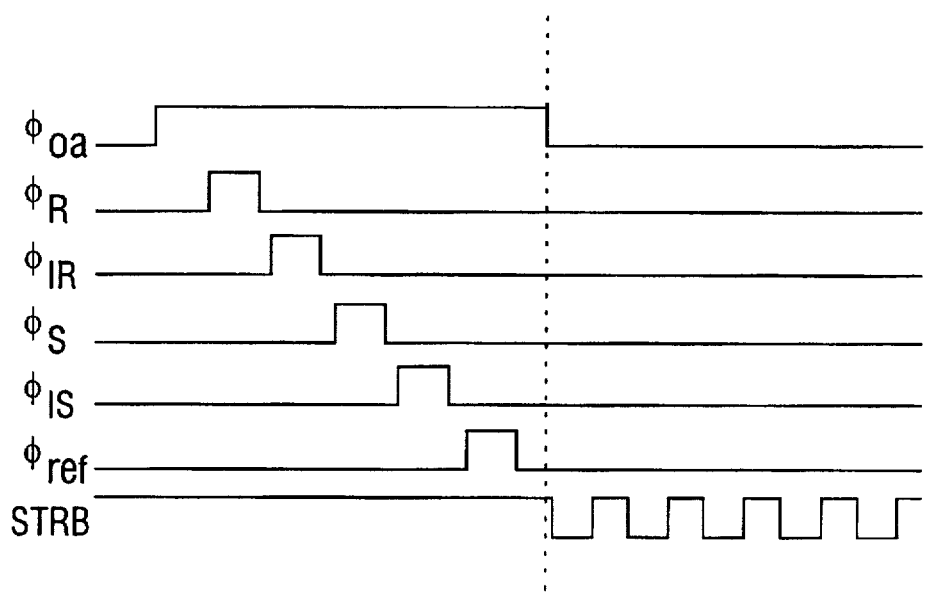
FIG. 7 shows a clock diagram of the circuit operation of the ADC in FIG. 6 of the present invention.

The operation of the converter is shown in the clock diagram in FIG. 7. In a first phase, the analog readout and charge transfer process occurs. Initially, an input switch 74 is switched on ($\phi_{on}$) to allow analog inputs to be converted to charge in capacitors 50 and 52. The reset level 75 of a focal-plane pixel output is then sampled onto the sampling capacitor pair 50, 52. This is accomplished by setting switch 76 high ($\phi R$) which is connected to the reset output of the focal plane array. The charge is then transferred from the capacitor pair 50, 52 onto the reset CTIA feedback capacitor 60 directing the reset level charge to one of the comparator inputs 78. This is done by setting switch 70 high ($\phi_{IR}$).

Similar readout procedures are used to direct the signal level of the pixel output to the other input node of the comparator 62. In particular, switch 80 is set high allowing the VS signal pixel output to be transferred to the sampling capacitor pair 50, 52. The charge is then transferred from the capacitor pair to the sample CTIA feedback capacitor 58 by turning on CTIA input switch 68 ($\phi_{IS}$). As a result, the sample charge is directed to the sample input 82 of the comparator 62. The reference voltage $V_{ref}$ is then sampled onto the capacitor pair 50, 52 using the reference voltage switch 84 which is connected to the $V_{ref}$ input ($\phi_{REF}$). The analog readout and charge transfer process is now complete and $\phi_{on}$ is hence turned low using switch 74.

The operation now proceeds to a second, conversion, phase. This begins by activating the comparator 62 control signal "strobe" (STRB). The comparator 62 compares the signal and reset levels at its inputs 82, 78. Its outputs are used to activate the input of one of the CTIA amplifiers 54, 56. This determines to which branch the specific charge package on capacitor 52 (C2) is to be transferred.

The comparator output feedbacks 86, 88 and flip flops 64, 66 are arranged in such a way that they will turn on the CTIA input switch 68, 70 that is on the higher voltage side. The reference voltage 84 is chosen to be higher than V+ by the amount of the sensor saturation.

The analog readout scheme above is such that the signal level is always lower than the reset level at the top of the capacitor pair (C1 and C2), while both are lower that the bias voltage V+, which is chosen to be two volts in this embodiment. After each charge transfer, the voltage level will flip to a symmetrical counterpart relative to the bias voltage level, V+. As a result, at the input nodes of the comparator, the initial signal level is always higher than the reset level.

In each conversion step, the higher voltage at the comparator input nodes 78, 82, will be reduced by a binary weighted voltage, while the lower ones stays the same. In this embodiment the higher voltage is selected and reduced by the binary weighted voltage. Alternatively, the lower voltage could be selected, and then increased by the binary weighted voltage. The result in either case would be the same.

Each binary-weighted referenced voltage is generated by means of the charge sharing between the two matched capacitors 50, 52 after the previous one is used in a charge transfer. For example, after the first step, the one-half $V_{ref}$ voltage capacitor 50 in C2 is transferred to the selected CTIA amplifier, and the remaining one-half voltage in this capacitor is then shared by both capacitors 50, 52. This results in each capacitor having a one-fourth $V_{ref}$ charge. In the next step, capacitor 52 will transfer its charge of one-fourth $V_{ref}$.

Figure 8:
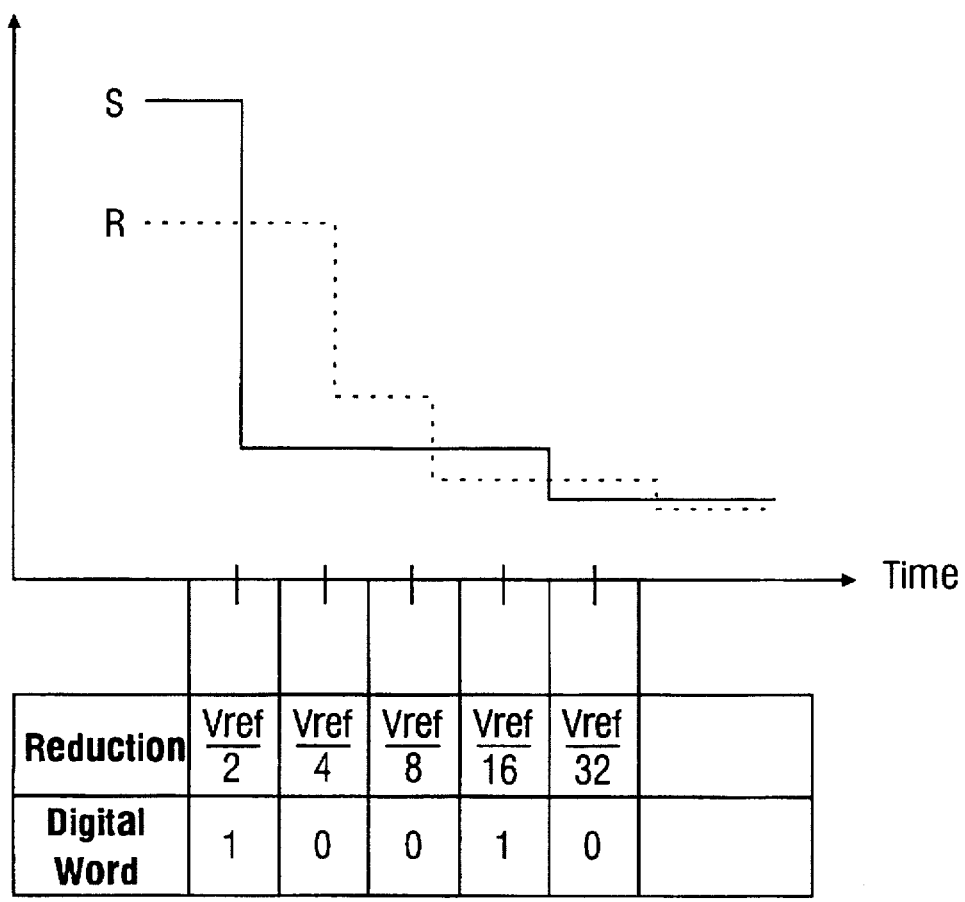
FIG. 8 shows the voltage evolution in the conversion process in a preferred embodiment of the invention.

FIG. 8 shows the voltage evolution in the analog-to-digital conversion process of the invention. In this Figure, the S charge level is initially higher than the R charge level. Since the S is higher in step one, the S side CTIA will be chosen by the comparator and will be reduced by an amount equivalent a one-half of the $V_{ref}$ charge. Also, as shown in FIG. 8, this will result in a one bit stored in shift register 72 as the most significant bit of the digital output. That is, digital "ones" are registered only when the S side is selected. For simplicity of illustration, only five bits are shown in FIG. 8.

In the second step, the R signal is larger and thus it is selected by the comparator to be reduced by the amount of the charge in capacitor 52, which is now one-fourth original the $V_{ref}$ charge. The result is a zero in the next most significant bit since there was no change in the S side.

Next, since the R input is still the larger side, it is selected and reduced by an amount of one-eighth of the $V_{ref}$ charge. Again, since no change in the S side occurred, the third bit in the word will be zero. In the fourth step, the S side is now the larger one and it will be reduced by an amount of one-sixteenth of the $V_{ref}$ charge and this will be represented by a one for the fourth bit. Finally, for the fifth bit of the digital word, the R side is larger and it is reduced by one-thirtysecond, resulting in a zero bit. In the ten bit ADC of the preferred embodiment of the present invention, this process continues for ten steps.

The operation of the different sections of the circuits of the ADC 49 can be synchronized by one clock signal "strobe" and its invert. As "strobe" becomes low, the charge transfer switches 68, 70 at the inputs of the CTIA are both off. By connecting the feedback lines 86, 88 to ground, the comparator output is fed into latches 90, 92. At the same time, charge sharing is performed between the matched capacitors 50, 52, generating the next reference voltage. When the "strobe" turns high, the charge partition switch 74 is turned off, the last words are fed to the charged transfer switches 70, 68 opening the side with the higher voltage so that the charge package on C2 is transferred to the feedback capacitor on that side. This reduces the higher voltage by the desired fraction of $V_{ref}$.

Another cycle of conversion then follows. The same "strobe" signal can also be used to control the data transmission in the shift register 72. In practice, the different operations need to be timed in the right sequence, which makes the proper alignment of different control signals important. Preferably, non-overlapping clocks should be adopted to enhance the operation of the converter 49.

Figure 9:
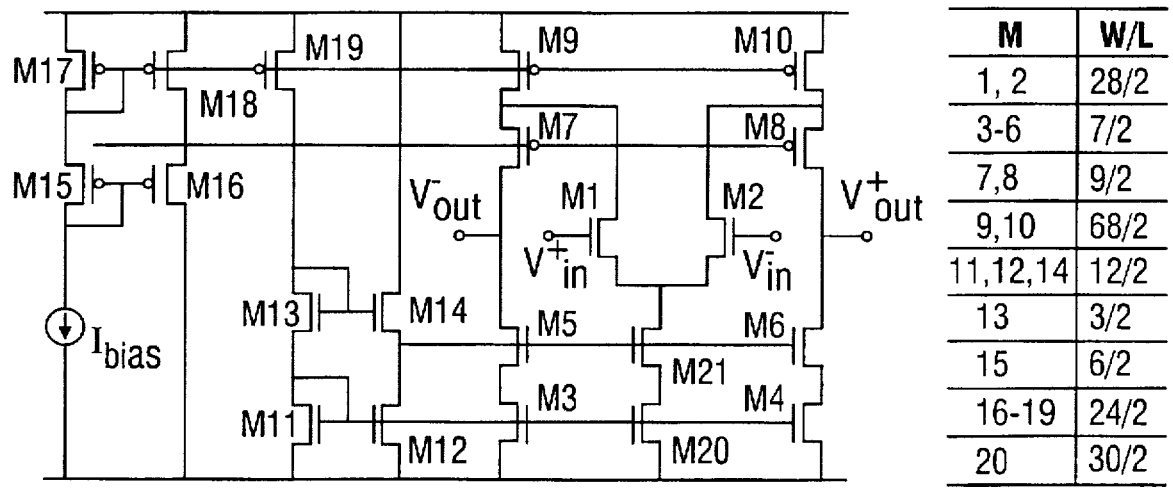
FIG. 9 shows a block diagram of a folded cascode op-amp used in the charge-integrating amplifier circuit of the invention.
Figure 10:
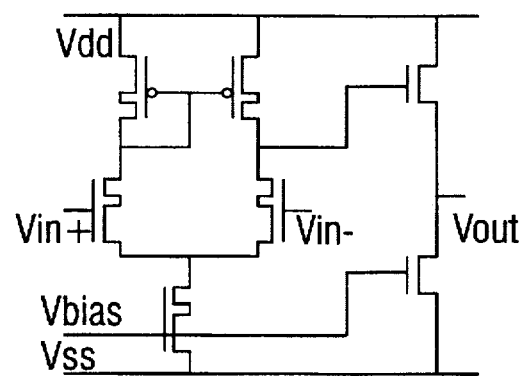
FIG. 10 shows a block diagram of a self cascode op-amp used with the invention.

Two different op-amp designs are used in the circuit for the CTIA 54, 56. The folded cascode op-amp shown in FIG. 9 is designed to have a DC gain of about 950. The other op amp design used is a self-cascode code op-amp which has a DC gain of about 500. FIG. 10 shows the self-cascode op-amp. In this amplifier, all the folded transistors are of size 4/2 and 4/12, while the output NMOS transistors are of 25/2.

Figure 11:
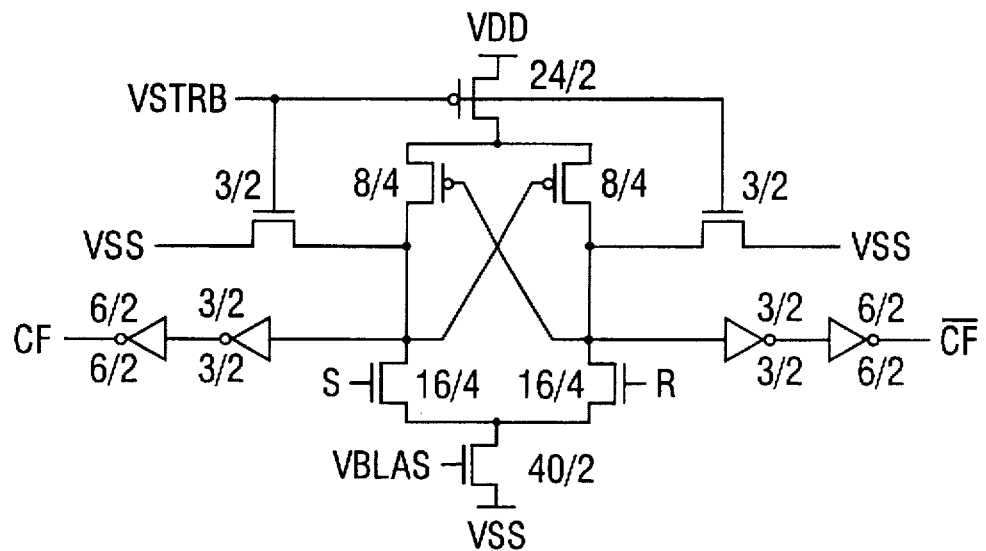
FIG. 11 shows a schematic diagram of a strobe comparator used in ADC of the invention.
Figure 12:
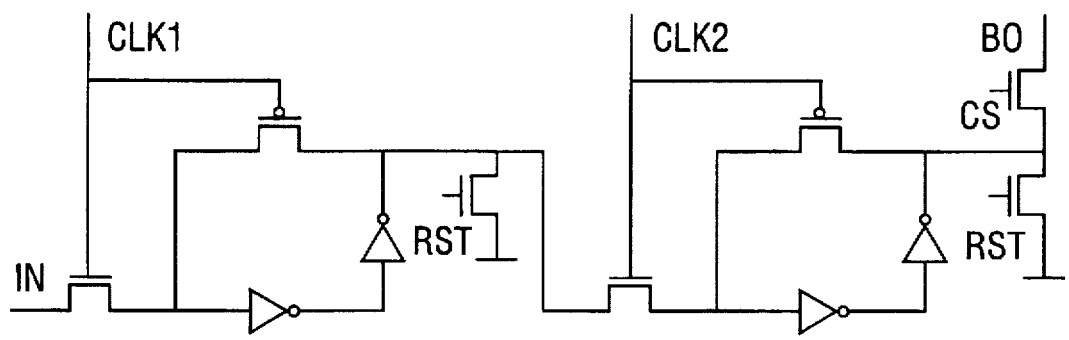
FIG. 12 shows a block diagram of a unit cell of the shift register used in the invention.

FIG. 11 shows a schematic of the comparator 62 design. FIG. 12 shows a unit cell of the shift register 72. The shift register is a static flip-flop design. The flip-flop cell 64, 66 shown in FIG. 6 consists of two invertors in series in a PMOS feedback switch between the input and output nodes.

Figure 15:
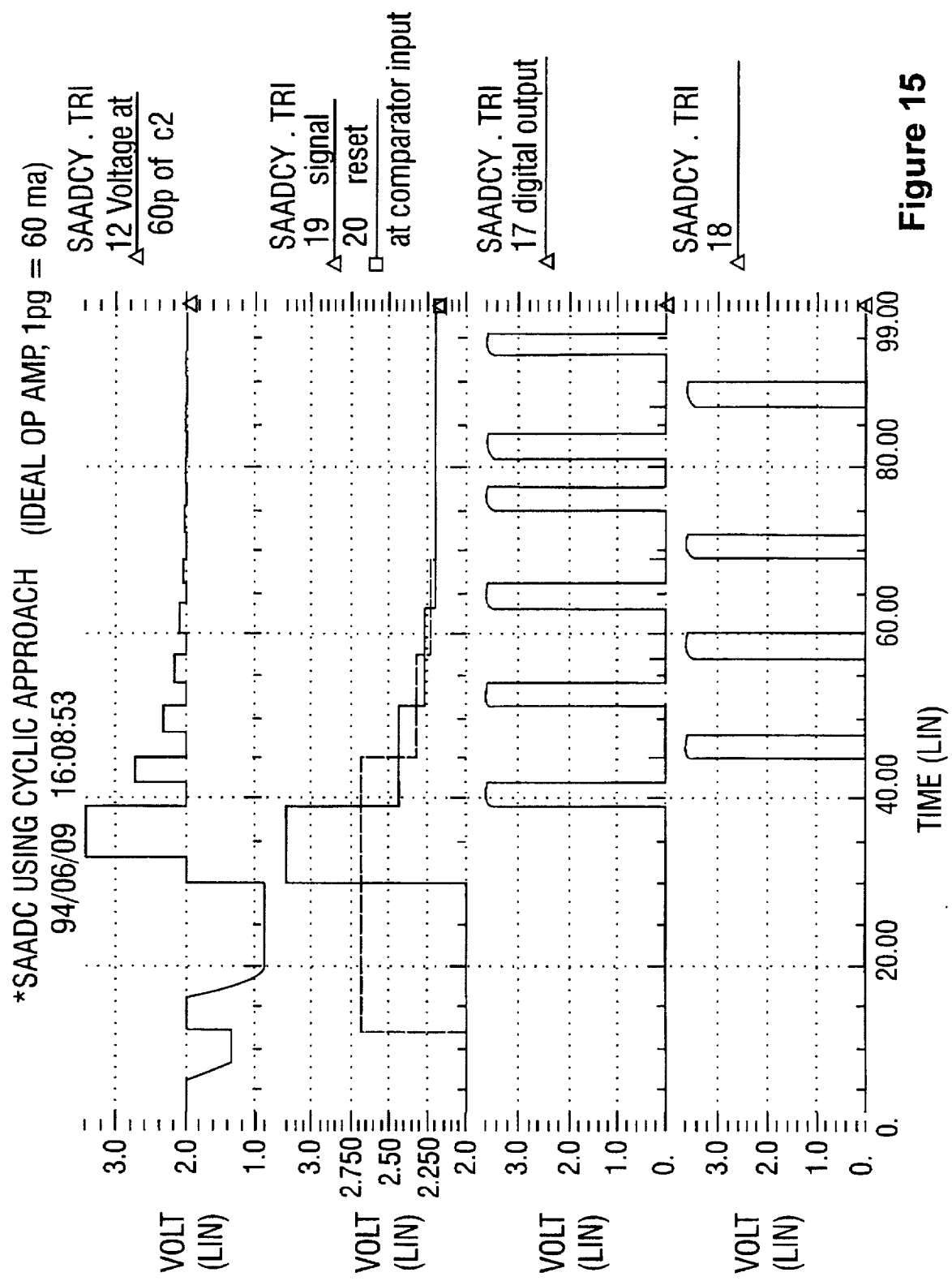
FIG. 15 shows simulation results of the ADC of the present invention using an ideal op-amp.
Figure 16:
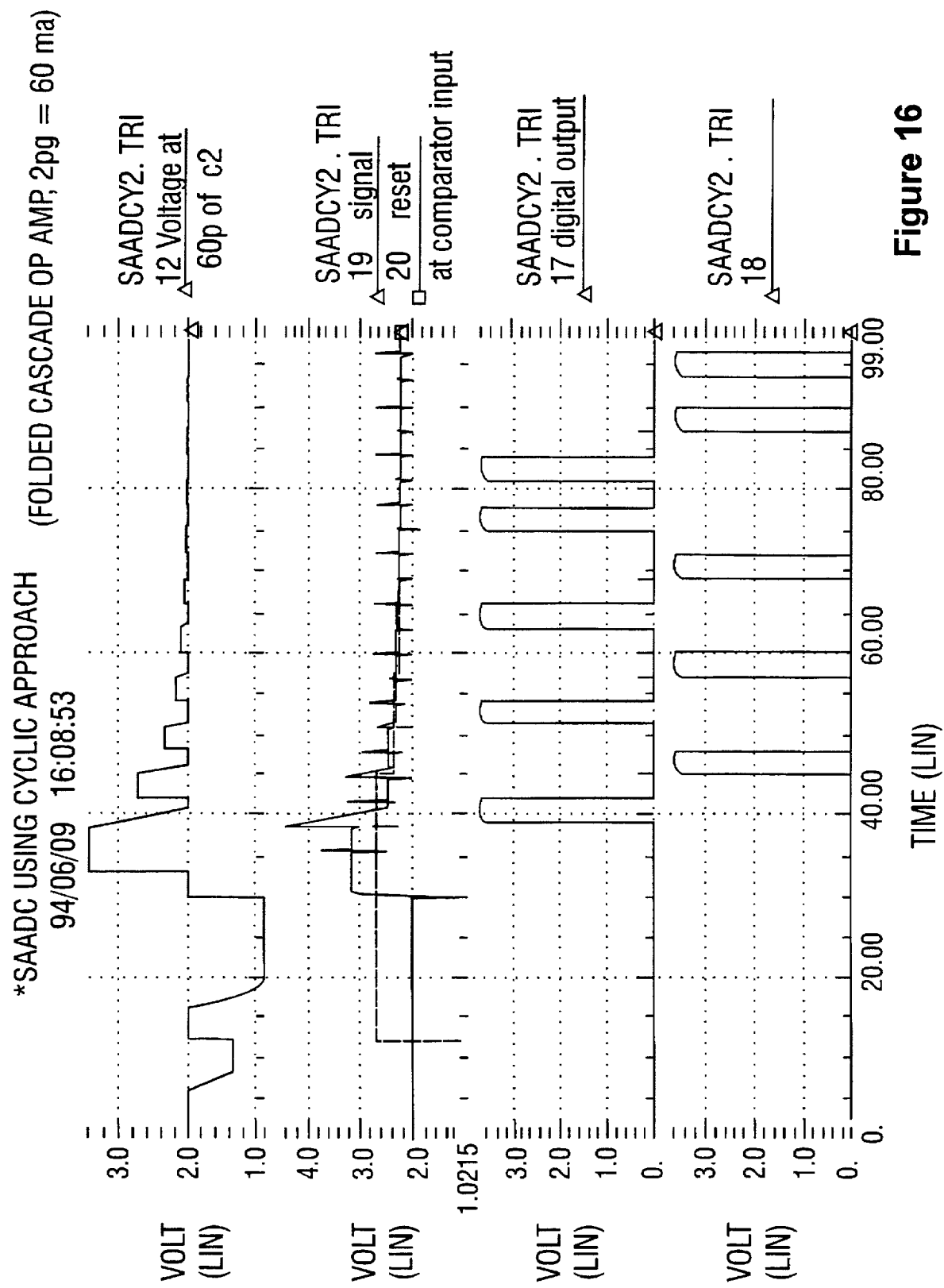
FIG. 16 shows simulation results of the ADC of the present invention using a folded cascode op-amp.
Figure 17:
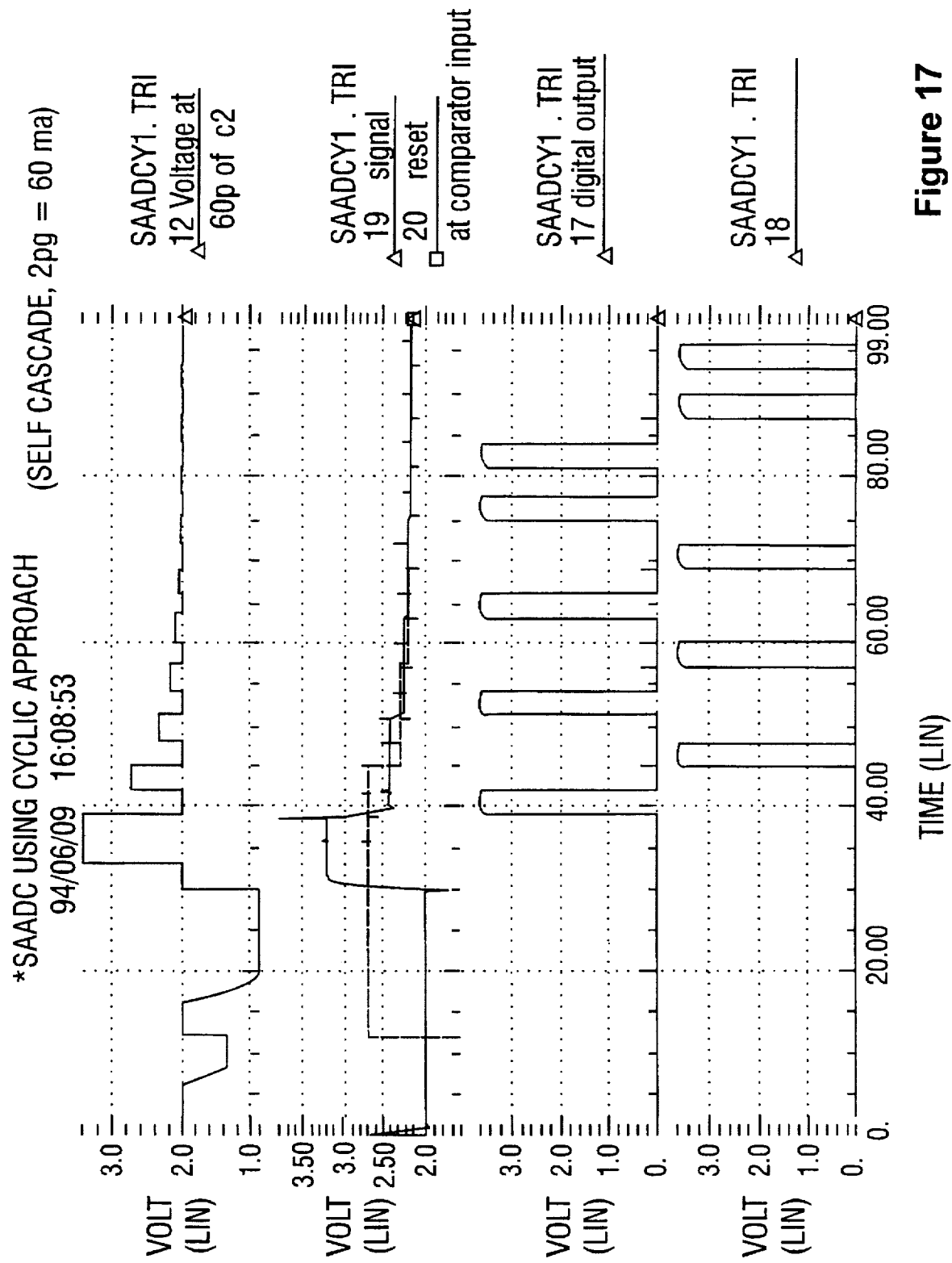
FIG. 17 shows a simulation of the ADC of the present invention using a self-cascode op-amp.

Spice simulations of the converter were done first by using an ideal op-amp as the CTIA gain stage. The results are shown in FIG. 15. The actual operation of the converter is simulated using both the folded cascode op-amp and self-cascode op-amp, discussed above. See FIGS. 16 and 17 respectively. The first row in FIGS. 15–17 shows the voltage at the top of the capacitor C2, manifesting the reference voltage scaling as the conversion process proceeds. The second row shows the voltage levels at the inputs of the comparator, showing each conversion step by the voltage step-down on the higher voltage side. The third and fourth rows show the digital input string and its complement. One sensor pixel was included when doing simulation, and the results shown are with a photo-diffusion current of 65 μA. Simulation was also done with extracted spice listing from the complete chip layout. Correct functionality in this simulation verified the layout.

Figure 18:
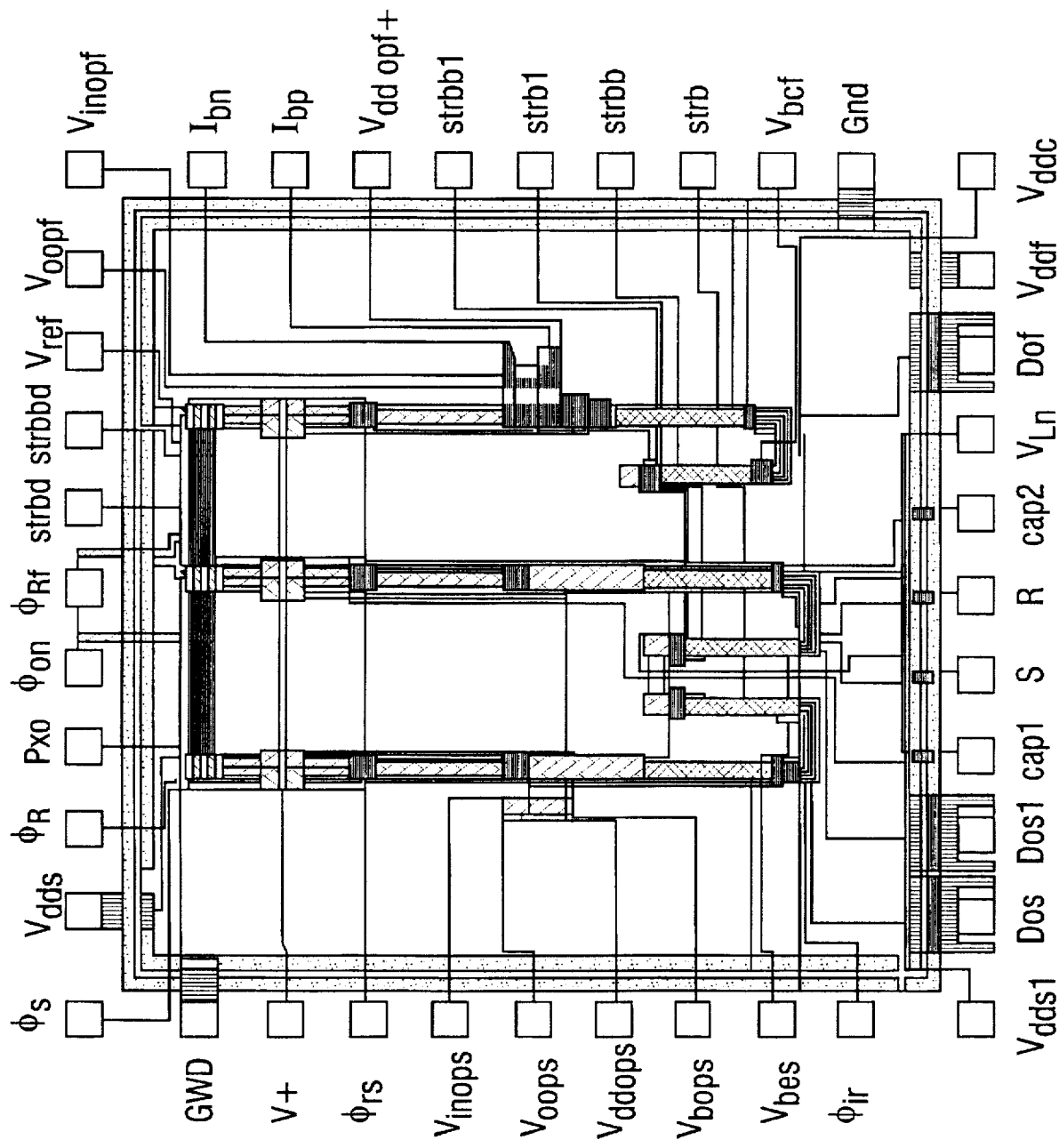
FIG. 18 shows chip layout and pad connections of the ADC of the present invention.

A test chip was laid out with two column circuits using two different op-amp designs. The two stand alone op-amps were also laid out to test them independent of the column circuits. The different strobe control signals were connected to different pads to ensure correct time sequence in chip operation. All other column control signals share pads when possible. The output shift register was not included because the number of pads is limited. As a result, the digital words from each converter will be read serially through one pad. FIG. 18 is the printout of the chip layout which illustrates the pad connections.

The on-chip ADC of the present invention, requires careful design of the op-amps to enhance gain under low biased current (low power) conditions. A chip was implemented by the inventors using a 1.2 micron CMOS foundry process. The ADC were laid out as 24 microns wide, for the 1.2 micron process, and were 3.8 millimeters long for a ten bit ADC.

Figure 19:
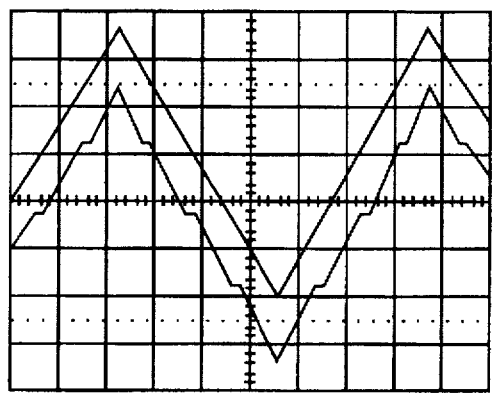
FIG. 19 shows an input/output waveform of the ADC of the invention.

The chip employing the ADC 49 was tested for input-output characteristics. FIG. 19 shows the input to the ADC as a one volt peak-to-peak triangular wave. The input is sampled many times over its period. The digital output was sent to a commercial digital-to-analog converter and the resultant analog output is displayed as well. A perfect ADC would result in a very smooth output weight form. The flat regions indicate a differential non-linearity effect. The top trace is the input, and the bottom trace is the digital output.

Figure 13:
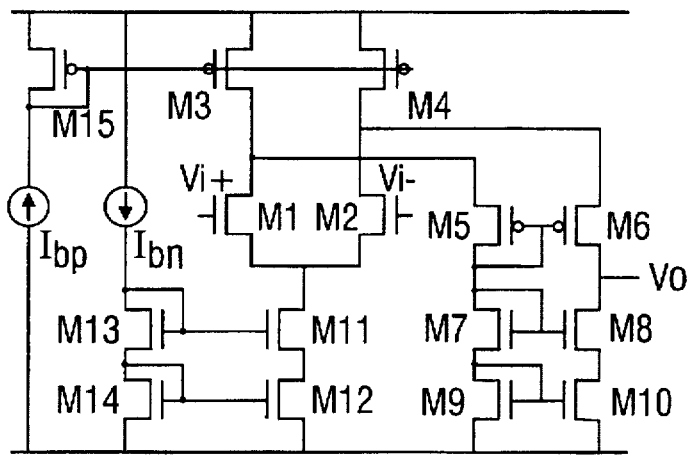
FIG. 13 shows a second embodiment of the folded cascode op-amp shown in FIG. 10.
Figure 14:
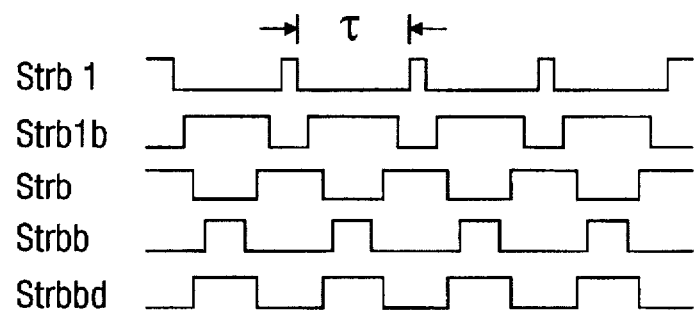
FIG. 14 shows a clock diagram of the circuit operation of an alternative embodiment of the ADC of the invention.

FIG. 13 shows a folded cascade code op-amp with an alternative design to the one shown in FIG. 9. Since only one output node is utilized in this op-amp, one output branch can be used to bias the other. This requires less outside bias and would be expected to make the op-amp more immune to gain deterioration caused by transistor threshold mismatch. Transistor sizing is also shown in FIG. 14 in the accompanying table. Spice simulation shows that the open loop DC gain of the op-amp ranges from 2.4K (Ibn=25 μA, Ibp=13 μA) to 3.4K (Ibn=5 μA, Ibp=3 μA) depending upon the bias condition.

As discussed previously, the different clock control signals must be aligned properly to ensure the correct function of the circuit. For example, the charge sharing process has to be completely ended before the integration switches are turned on to start the charge transfer process. Considering the operation sequence of the whole circuit, an improved non-overlapping clock sequence may be used as shown in FIG. 14. STRB and STRBB are shown in the block diagram in FIG. 6. For the converter of the invention without the latches at the output of the comparator, the control signals reduce to STRB and STRBBD (and its inverse STRRD). Compared with the clock diagram in FIG. 14, STRBBD has to be inverted, becoming the same polarity with STRB, and T STRBBD has to be longer than T STRB.

Although only a few embodiments have been described in detail above, those having ordinary skill in the art will certainly understand that many modifications are possible in the preferred embodiment without departing from the teachings thereof.

All such modifications are intended to be encompassed within the following claims.

What is claimed is:

1. An analog-to-digital converter comprising:
   two signal inputs receiving two senses of a differential analog signal;
   a reference voltage input receiving and storing a reference voltage;
   a voltage to charge converter coupled to the signal and reference inputs generating differential and reference charges;
   first and second charge integrating circuits, coupled to the voltage to charge converter, receiving and storing input charges from the voltage to charge converter, and generating an output signal proportional to the stored charge;
   a comparator having two inputs respectively receiving outputs of said first and second charge integrating circuit and generating an output signal indicating which of said two inputs is larger;
   said charge integrating circuits subtracting a portion of the reference charge from the charge stored in the charge integrating circuit having the larger stored charge as determined by the comparator; and
   a register storing and outputting the results of a series of comparator outputs, each result representing a lesser significant new bit in an output digital word that represents the voltage of the differential analog signal.

2. An analog-to-digital converter as in claim 1 wherein when the first charge integrating circuit has the larger signal, a digital "one" is stored by the register, otherwise a digital "zero" is stored.

3. An analog-to-digital converter as in claim 1 wherein the charge integrating circuits include sample and reset input switches responsive to the comparator output to transfer a portion of the reference charge in the sample and hold capacitor to the charge integrating circuit having the larger signal.

4. An analog-to-digital converter as in claim 3 wherein said sample and hold comparators each carry an equal charge.

5. An analog-to-digital converter as in claim 1 wherein the predetermined fraction is one-half.

6. An imaging system comprising:
   an array of image sensor pixels;
   an input, receiving reset and sample output signals from individual pixels in the image sensor and also receiving an input reference voltage;
   sample and hold capacitors coupled to the input and converting the output signals to respective charge values;
   a reset charge integrating amplifier circuit coupled to the sample and hold capacitors receiving said reset input charge values, said reset charge integrating amplifier circuit having an output;
   a sample charge integrating amplifier circuit coupled to the sample and hold capacitors receiving said sample input charge value signal, said sample charge integrating amplifier circuit having an output;
   a comparator having reset and sample inputs, the reset input receiving the output of the reset charge integrating circuit and the sample input receiving the output of the sample charge integrating circuit, the comparator producing an output indicating which input is larger;
   a switch, selectively opening and closing to allow the reference voltage to be stored as charge in the sample and hold capacitors;
   the sample and reset charge integrating circuits including sample and reset input switches responsive to the comparator output to transfer a portion of the reference charge in the sample and hold capacitor to the charge integrating circuit having the larger signal as determined by said comparator;
   wherein each charge integrating circuit subtracts the portion of the reference charge from the existing reset or sample charge therein, and wherein the comparator repeats the comparator determination for each new smaller value of charge integrating circuit output; and
   a register storing and outputting a results of each comparator determination, each comparator determination representing a lesser significant new bit in the output digital word representing the differential voltage between the sample and reset inputs, such that the sample being larger represents a digital one and the reset being larger represents a digital zero.

7. The imaging system of claim 6 wherein said portion of the reference charge is one-half.

8. An imaging system according to claim 5 wherein the sample and hold capacitors include two charge sharing capacitors, one of which transfers one-half of the total charge to the charge integrating amplifier circuit, after which the charge in the second capacitor is shared with the first so each will have one-half the value prior to the transfer.

9. An imaging system according to claim 6 wherein said array of image sensors includes a column-parallel read output architecture.

10. An imaging system comprising:
    an array of image sensors comprising an array of pixel sensors;
    a column-parallel readout circuitry;
    a plurality of successive approximation analog-to-digital converters on said substrate, each analog-to-digital converter comprising:
        two inputs receiving a differential analog signal;
        a reference voltage input receiving a reference voltage;
        a voltage to charge converter coupled to the differential and reference inputs;
        first and second charge integrating amplifier circuits, coupled to the voltage to charge converter receiving two input signals from the voltage to charge converter, and generating an output signal;
        a comparator having two inputs receiving the output signal of each charge integrating amplifier circuit, wherein a corresponding charge integrating circuit subtracts a portion of the reference charge from the charge integrating circuit having the larger signal, and wherein the voltage to charge converter reduces the reference voltage each time a comparison is made by a predetermined fraction; and
        a register storing and outputting the results of each comparison, each comparison representing a lesser significant new bit in the output digital word that represents the differential voltage between the sample and reset inputs, such that when the first charge integrating circuit has the larger signal, a digital "one" is stored, otherwise a digital "zero" is stored.

11. An imaging system according to claim 10, wherein each column has one associated analog-to-digital converter.

12. An imaging system according to claim 10, wherein each analog-to-digital converter is connected to more than one column.

13. A method of performing analog-to-digital conversion comprising:
    receiving a differential analog signal;
    receiving a reference voltage;
    converting the differential and reference inputs into differential and reference charges respectively, integrating the differential analog signal and the reference voltage, and generating an output signal in response thereto;
    comparing the differential analog signal with the reference voltage;
    subtracting a portion of the reference charge from the compared signal having the larger signal, and reducing the reference voltage each time a comparison is made by a predetermined fraction; and
    storing and outputting the results of each comparing as a digital word representing the value of the differential analog signal, each comparing representing a lesser significant new bit in the output digital word, such that when the differential analog signal has the larger signal, a digital "one" is stored, otherwise a digital "zero" is stored.

14. A method of performing analog-to-digital conversion comprising:
    converting a first side of a differential signal to be digitized into a charge value;
    transferring said charge to a first branch of a charge integrating amplifier circuit;
    converting a reference voltage to a charge value;
    splitting the reference charge value in half;
    converting the second side of the differential signal to be digitized into a charge value;
    transferring the second side charge value to a second branch of the charge integrating amplifier circuit;
    comparing the value of the charge on the first branch of the charge integrating amplifier circuit with the one on the second branch;
    transferring one half of the split reference charge to the charge integrating amplifier circuit branch with the lesser signal as determined in the comparing step, wherein the charge is increased by a value of one-half of the reference signal;

splitting the other one-half of the reference signal into two charges of one-fourth reference signal value;

repeating the comparing, transferring and splitting steps n–times and outputting a digital word containing n bits, wherein each bit represents which branch had the larger charge in the comparing step.

* * * * *